United States Patent
Yang (10) Patent No.: US 9,129,963 B1
(45) Date of Patent: Sep. 8, 2015

(54) SEMICONDUCTOR DEVICES HAVING THROUGH ELECTRODES, SEMICONDUCTOR PACKAGES INCLUDING THE SAME, ELECTRONIC SYSTEMS INCLUDING THE SAME, AND METHODS OF MANUFACTURING THE SAME

(71) Applicant: SK hynix Inc., Icheon-si Gyeonggi-do (KR)

(72) Inventor: Ju Heon Yang, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/621,140

(22) Filed: Feb. 12, 2015

(30) Foreign Application Priority Data

Sep. 18, 2014 (KR) .................. 10-2014-0124451

(51) Int. Cl.
*H01L 23/48* (2006.01)
*H01L 23/522* (2006.01)
*H01L 25/065* (2006.01)
*H01L 23/528* (2006.01)
*H01L 23/532* (2006.01)

(52) U.S. Cl.
CPC .......... *H01L 23/5226* (2013.01); *H01L 23/528* (2013.01); *H01L 23/5329* (2013.01); *H01L 25/0657* (2013.01); *H01L 2225/06513* (2013.01)

(58) Field of Classification Search
CPC ............................................. H01L 2225/06541
USPC .................................. 257/737, 738, E21.585
See application file for complete search history.

(56) References Cited

U.S. PATENT DOCUMENTS

| | | | |
|---|---|---|---|
| 2009/0026614 A1* | 1/2009 | Jung | 257/738 |
| 2010/0096738 A1 | 4/2010 | Simmons-Matthews et al. | |
| 2011/0068466 A1* | 3/2011 | Chen et al. | 257/737 |
| 2013/0127049 A1 | 5/2013 | Wang et al. | |

* cited by examiner

*Primary Examiner* — Brook Kebede
(74) *Attorney, Agent, or Firm* — William Park & Associates Ltd.

(57) ABSTRACT

A semiconductor device may include a substrate including a first surface and a second surface, a through electrode penetrating the substrate to include a protrusion that protrudes from the second surface of the substrate, and a front side bump electrically coupled to the through electrode and disposed on the first surface of the substrate. The semiconductor device may include a first passivation pattern disposed on the first surface of the substrate to substantially surround a sidewall of the front side bump and may be formed to include an uneven surface, and a second passivation pattern disposed on the second surface of the substrate to include an uneven surface. The protrusion of the through electrode may penetrate the second passivation pattern to protrude from the uneven surface of the second passivation pattern.

25 Claims, 9 Drawing Sheets

SEMICONDUCTOR DEVICES HAVING THROUGH ELECTRODES, SEMICONDUCTOR PACKAGES INCLUDING THE SAME, ELECTRONIC SYSTEMS INCLUDING THE SAME, AND METHODS OF MANUFACTURING THE SAME

CROSS-REFERENCE TO RELATED APPLICATION

The present application claims priority under 35 U.S.C. 119(a) to Korean Application No. 10-2014-0124451, filed on Sep. 18, 2014, in the Korean intellectual property Office, which is incorporated herein by reference in its entirety as set forth in full.

BACKGROUND

1. Technical Field

Various embodiments of the present disclosure generally relate to semiconductor devices including through electrodes, semiconductor packages including the same, electronic systems including the same, memory cards including the same, and methods of manufacturing the same.

2. Related Art

Ultra small-sized semiconductor devices with large capacities are increasingly in demand with the development of smaller and higher performance electronic products. A plurality of semiconductor chips may be assembled in a single semiconductor package to increase a data storage capacity of the semiconductor device. That is, the data storage capacity of the semiconductor device may be readily increased using a multi-chip package technique.

However, even though the multi-chip package technique is used to increase the data storage capacity of the semiconductor device, there may be limitations associated with obtaining a sufficient space needed for electrical connections between the plurality of semiconductor chips in the multi-chip package as the number of the semiconductor chips increases. Recently, through silicon vias (TSVs) have been proposed to resolve the limitations associated with the multi-chip package techniques. The TSVs may be formed to penetrate a plurality of chips at a wafer level, and the chips stacked in the package may be electrically and physically connected to each other by the TSVs. Accordingly, if the TSVs are employed in the packages, the performance and the storage capacity of the packages may be improved.

SUMMARY

According to an embodiment, a semiconductor device may include a substrate including a first surface and a second surface, a through electrode penetrating the substrate to include a protrusion that protrudes from the second surface of the substrate, and a front side bump electrically coupled to the through electrode and disposed on the first surface of the substrate. The semiconductor device may include a first passivation pattern disposed on the first surface of the substrate to substantially surround a sidewall of the front side bump and may be formed to include an uneven surface defined by first protrusions and first grooves between the first protrusions, and a second passivation pattern disposed on the second surface of the substrate and may be formed to include an uneven surface defined by second protrusions and second grooves between the second protrusions. The protrusion of the through electrode penetrates the second passivation pattern to protrude from the uneven surface of the second passivation pattern.

According to an embodiment, a semiconductor package may include a lower semiconductor chip and an upper semiconductor chip. The lower semiconductor chip may include a first substrate including a first surface and a second surface, a first through electrode penetrating the first substrate to include a protrusion that protrudes from the second surface, a front side bump disposed on the first surface of the first substrate and electrically coupled to an end of the first through electrode, a first passivation pattern disposed on the first surface of the first substrate and may be formed to include first protrusions and first grooves between the first protrusions, and a second passivation pattern disposed on the second surface of the first substrate and may be formed to include second protrusions and second grooves between the second protrusions. The upper semiconductor chip may be bonded to the first passivation pattern of the lower semiconductor chip. The upper semiconductor chip may include a second through electrode, and a portion of the second through electrode is inserted into the front side bump of the lower semiconductor chip.

According to an embodiment, a method of manufacturing a semiconductor device may include forming a through electrode that extends from a first surface of a substrate toward a second surface of the substrate. A first passivation pattern may be formed on the first surface of the substrate. The first passivation pattern may be formed to include first protrusions and first grooves between the first protrusions. A front side bump may be formed in the first passivation pattern. The front side bump may be electrically coupled to the through electrode. The second surface may be recessed to protrude an end of the through electrode from the recessed second surface. A second passivation pattern may be formed on the recessed second surface to substantially surround a sidewall of the protrusion of the through electrode. The second passivation pattern may be formed to include an uneven surface provided by second protrusions and second grooves between the second protrusions.

The first passivation pattern is formed to include an uneven surface provided by the first protrusions and the first grooves between the first protrusions, wherein the first passivation pattern is formed to include a silicon oxide material. The front side bump is formed to include a top surface, wherein the top surface is recessed from a level of top surfaces of the first protrusions.

Forming the second passivation pattern includes forming a second passivation layer on the recessed second surface of the substrate and the protrusion of the through electrode, the second passivation layer being formed by sequentially stacking a lower insulation layer and an upper insulation layer, planarizing the second passivation layer, and etching the planarized second passivation layer to form the second grooves defining the second protrusions. The lower insulation layer is formed to include a silicon nitride material, and wherein the upper insulation layer is formed to include a silicon oxide material.

The method further comprises forming a capping layer substantially covering the protrusion of the through electrode protruding from the uneven surface of the second passivation pattern, wherein the capping layer includes at least one selected from the group consisting of a nickel (Ni) material and a gold (Au) material.

According to an embodiment, an electronic system may include a semiconductor device. The semiconductor device may include a substrate including a first surface and a second surface, a through electrode penetrating the substrate to include a protrusion that protrudes from the second surface of the substrate, and a front side bump electrically coupled to the through electrode and disposed on the first surface of the substrate. The semiconductor device may include a first passivation pattern disposed on the first surface of the substrate to substantially surround a sidewall of the front side bump and may be formed to include an uneven surface defined by first protrusions and first grooves between the first protrusions. The semiconductor device may include a second passivation pattern disposed on the second surface of the substrate and may be formed to include an uneven surface defined by second protrusions and second grooves between the second protrusions. The protrusion of the through electrode may penetrate the second passivation pattern to protrude from the uneven surface of the second passivation pattern.

According to an embodiment, a memory card may include a semiconductor device. The semiconductor device may include a substrate including a first surface and a second surface, a through electrode penetrating the substrate to include a protrusion that protrudes from the second surface of the substrate, and a front side bump electrically coupled to the through electrode and disposed on the first surface of the substrate. The semiconductor device may include a first passivation pattern disposed on the first surface of the substrate to substantially surround a sidewall of the front side bump and may be formed to include an uneven surface defined by first protrusions and first grooves between the first protrusions, and a second passivation pattern disposed on the second surface of the substrate and may be formed to include an uneven surface defined by second protrusions and second grooves between the second protrusions. The protrusion of the through electrode may penetrate the second passivation pattern to protrude from the uneven surface of the second passivation pattern.

DETAILED DESCRIPTION

In the following embodiments, it will be understood that when an element is referred to as being located "on", "over", "above", "under", "beneath" or "below" another element, it may directly contact the other element, or at least one intervening element may be present therebetween. Accordingly, the terms such as "on", "over", "above", "under", "beneath", "below" and the like that are used herein are for the purpose of describing particular embodiments only and are not intended to limit the scope of the present disclosure.

In the drawings, a thicknesses and length of components are exaggerated compared to actual physical thickness and intervals for convenience of illustration. In the following description, a detailed explanation of known related functions and constitutions may be omitted to avoid unnecessarily obscuring the subject manner. Furthermore, 'connected/coupled' represents that one component is directly coupled to another component or indirectly coupled through another component. In this specification, a singular form may include a plural form as long as it is not specifically mentioned in a sentence. Furthermore, "include/comprise" or "including/comprising" used in the specification represents that one or more components, steps, operations, and elements exist or are added.

Various embodiments may be directed to semiconductor devices including through electrodes, semiconductor packages including the same, electronic systems including the same, memory cards including the same, and methods of manufacturing the same.

Figure 1:
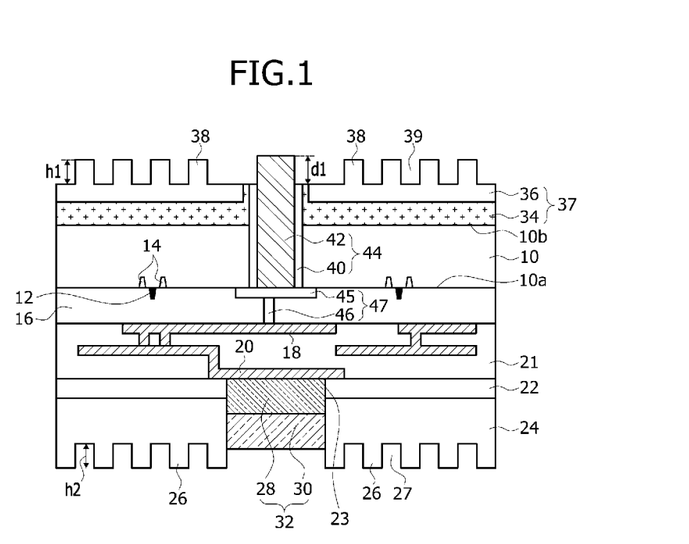
FIG. 1 is a cross-sectional view illustrating a representation of a semiconductor device according to an embodiment.

FIG. 1 is a cross-sectional view illustrating a representation of a semiconductor device according to an embodiment.

Referring to FIG. 1, a semiconductor device according to an embodiment may include a substrate 10, a through electrode 44 penetrating the substrate 10, and a front side bump 32. The front side bump 32 may be disposed on a first surface 10a of the substrate 10 and electrically connected to the through electrode 44.

The first surface 10a of the substrate 10 may correspond to a front side surface adjacent to active regions defined in the substrate 10. The substrate 10 may include a second surface 10b opposing the first surface 10a. The second surface 10b of the substrate 10 may correspond to a backside surface. Source/drain regions 14 of transistors may be disposed in the active regions adjacent to the first surface 10a. Gate electrodes 12 of the transistors may be disposed on the first surface 10a. The first surface 10a of the substrate 10 and the gate electrodes 12 of the transistors may be covered with an interlayer insulation layer 16, and circuit pattern 18 such as bit lines for applying electrical signals to the transistors may be disposed on a surface of the interlayer insulation layer 16 opposite to the substrate 10.

The through electrode 44 may include a metal through electrode 42 filling a through hole that penetrates the substrate 10 from the first surface 10a toward the second surface 10b. The metal through electrode 42 may include, for example, a copper material. The through electrode 44 may further include a barrier layer 40. The barrier layer 40 may be disposed between the metal through electrode 42 and the substrate 10 to surround a sidewall of the metal through electrode 42. The barrier layer 40 may be disposed to suppress or prevent metal atoms in the metal through electrode 42 from being diffused into the substrate 10. The through electrode 44 may include a first end adjacent to the first surface 10a of the substrate 10. The through electrode 44 may include a second end adjacent to the second surface 10b of the substrate 10.

The first end of the through electrode 44 may include a flat surface. The flat surface may be substantially coplanar with the first surface 10a of the substrate 10, as illustrated in FIG. 1. Alternatively, the first end of the through electrode 44 (actually, the metal through electrode 42) may protrude from the first surface 10a of the substrate 10 such that the first end of the through electrode 44 has a "T"-shaped configuration in a cross-sectional view. The through electrode 44 may be electrically connected to the circuit pattern 18 through an interconnection portion 47. The interconnection portion 47 may include an interconnection pattern 45 disposed on the first end of the through electrode 44. The interconnection portion 47 may include a vertical plug 46 disposed between the interconnection pattern 45 and the circuit pattern 18. The interconnection portion 47 may be disposed in an interlayer insulation layer 16 covering the first surface 10a. The circuit pattern 18 may be electrically connected to a bonding pad 20. The circuit pattern 18 may be electrically connected to a bonding pad 20 for electrically connecting the through electrode 44 to an external circuit board. The circuit pattern 18 and the bonding pad 20 may be disposed in a first insulation layer 21. The first insulation layer 21 may cover a surface of the interlayer insulation layer 16 opposite to the substrate 10. The bonding pad 20 may be exposed at a surface of the first insulation layer 21 opposite to the interlayer insulation layer 16. A second insulation layer 22 may be disposed on the first insulation layer 21. A first passivation pattern 24 may be disposed on the second insulation layer 22. A surface of the bonding pad 20 may be exposed by an opening 23. The opening 23 may penetrate the second insulation layer 22 and the first passivation pattern 24. The bonding pad 20 may include an aluminum (Al) material or a copper (Cu) material.

The front side bump 32 may be disposed in the opening 23 to be electrically connected to the bonding pad 20. The front side bump 32 may be configured to include a first metal layer 28 disposed on the bonding pad 20 and a second metal layer 30 disposed on the first metal layer 28. The first metal layer 28 may include a pillar shape or substantially a pillar shape and may include a copper (Cu) material. The second metal layer 30 may include a silver (Ag) material or a tin (Sn) material.

A front surface of the first passivation pattern 24 opposite to the second insulation layer 22 may include an uneven profile. The uneven profile may be defined by, for example, first protrusions 26 protruding from the level of a front surface of the front side bump 32 opposite to the bonding pad 20 and first grooves 27 between the first protrusions 26. The first passivation pattern 24 may include an insulation material, for example, a silicon oxide material.

The second end of the through electrode 44 may protrude from the second surface 10b of the substrate 10. The second surface 10b of the substrate 10 may be covered with a second passivation pattern 37. The second passivation pattern 37 may be formed to include an uneven surface. The second passivation pattern 37 may include a lower insulation layer 34 and an upper insulation layer 36. The upper insulation layer 36 stacked on the lower insulation layer 34 may include an insulation material different from the lower insulation layer 34. For example, the lower insulation layer 34 may include a silicon nitride material, and the upper insulation layer 36 may include a silicon oxide material. A surface of the upper insulation layer 36 opposite to the lower insulation layer 34 may include an uneven profile. The uneven profile may be defined by second protrusions 38 and second grooves 39 between the second protrusions 38. A height H2 of the first protrusions 26 may be substantially equal to a height H1 of the second protrusions 38.

The second end of the metal through electrode 42 may protrude from bottom surfaces of the second passivation pattern 37 by a predetermined height D1. The first protrusions 26 of the first passivation pattern 24 may be disposed to be vertically aligned with respective ones of the second grooves 39 of the second passivation pattern 37. The first grooves 27 of the first passivation pattern 24 may be disposed to be vertically aligned with respective ones of the second protrusions 38 of the second passivation pattern 37.

Figure 2:
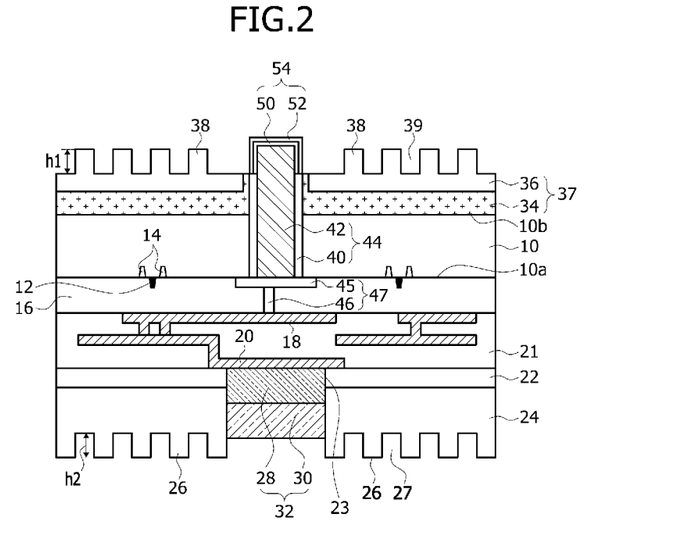
FIG. 2 is a cross-sectional view illustrating a representation of a semiconductor device according to an embodiment.

FIG. 2 is a cross-sectional view illustrating a representation of a semiconductor device according to an embodiment. The embodiment illustrated in FIG. 2 may have substantially the same configuration as the embodiments illustrated in FIG. 1 except that a protrusion of a through electrode is covered with a capping layer. In FIG. 2, the same reference numerals as used in FIG. 1 denote the same elements. Thus, descriptions of the same elements as set forth in the embodiments of FIG. 1 will be omitted or briefly mentioned in these embodiments relating to FIG. 2.

Referring to FIG. 2, a semiconductor device according to an embodiment may include a substrate 10. The semiconductor device may include a through electrode 44 penetrating the substrate 10. The semiconductor device may include a front side bump 32 disposed on a first surface 10a of the substrate 10 and electrically connected to the through electrode 44. A first passivation pattern 24 including an uneven surface may be disposed on the first surface 10a of the substrate 10, and a second passivation pattern 37 including an uneven surface may be disposed on a second surface 10b of the substrate 10 opposite to the first passivation pattern 24.

An end of a metal through electrode 42 constituting the through electrode 44 may protrude from a surface of the second passivation pattern 37. The protrusion of the metal through electrode 42 may be covered with a capping layer 54. The capping layer 54 may include a first capping layer 50 and a second capping layer 52 stacked on the first capping layer 50. The first capping layer 50 may include a nickel (Ni) material, and the second capping layer 52 may include a gold (Au) material. In various embodiments, the capping layer 54 may be formed of a single material layer, for example, a nickel layer or a gold layer.

In the event that the protrusion of the metal through electrode 42 is combined with another semiconductor device, the protrusion of the metal through electrode 42 may be bonded to a front side bump of the other semiconductor device. In such examples, the protrusion of the metal through electrode 42 may react on the front side bump of the other semiconductor device to excessively generate and grow an inter-metallic compound (IMC) material. However, according to the present embodiments, the capping layer 54 may be covered with the capping layer 54, as described above. Thus, even though the protrusion of the metal through electrode 42 is bonded to the front side bump of the other semiconductor device, the capping layer 54 may prevent the IMC material from being excessively grown. The capping layer 54 may be formed using an electroless plating technique.

FIGS. 3 to 12 illustrate a method of manufacturing a representation of a semiconductor device according to an embodiment.

Figure 3:
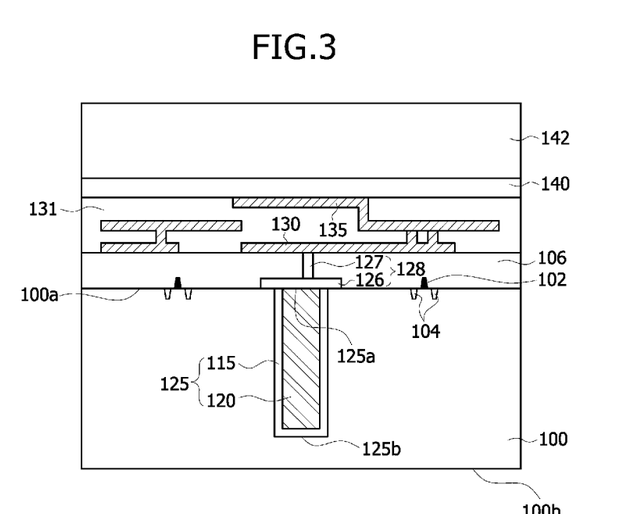
FIGS. 3 to 12 are cross-sectional views illustrating a representation of a method of manufacturing a semiconductor device according to an embodiment.

Referring to FIG. 3, a semiconductor substrate 100 including a through electrode 125 therein may be provided. The semiconductor substrate 100 may include a first surface 100a and a second surface 100b substantially opposite to each other. The first surface 10a of the semiconductor substrate 100 may correspond to a front side surface of the semiconductor substrate 100. The second surface 10b of the semiconductor substrate 100 may correspond to a backside surface of the semiconductor substrate 100. In an embodiment, the front side surface of the semiconductor substrate 100 may be regarded as a surface of an active region. The active region may be, for example, a region whereby active elements or passive elements may be formed. The backside surface of the semiconductor substrate 100 may be regarded as an opposite surface to the front side surface. The semiconductor substrate 100 may be a substrate used in fabrication of, for example but not limited to, semiconductor memory devices, semiconductor logic devices, photo devices or display units. In an embodiment, the semiconductor substrate 100 may be a silicon substrate, but not limited thereto.

Transistors including gate electrodes 102 and source/drain regions 104 may be formed on the first surface 100a of the semiconductor substrate 100 and in the active regions of the semiconductor substrate 100. An interlayer insulation layer 106 may be formed on the first surface 100a of the semiconductor substrate 100 to cover the transistors. A first insulation layer 131 may be formed on the interlayer insulation layer 106. A circuit pattern 130 and a bonding pad 135 may be formed in the first insulation layer 131. The circuit pattern 130 may include bit lines for applying electrical signals to the source/drain regions 104 or word lines for applying electrical signals to the gate electrodes 102.

The through electrode 125, for example, a through silicon via (TSV) may be formed in the semiconductor substrate 100, as described above. The through electrode 125 may be formed in a trench that extends from the first surface 100a toward the second surface 100b. The through electrode 125 may be formed to include a barrier layer 115 covering or substantially covering an inner wall of the trench and a metal through electrode 120 filling the trench surrounded by the barrier layer 115. In various embodiments, the trench may be formed by selectively removing a portion of the semiconductor substrate 100 using, for example, a laser drilling process. After the trench is formed in the semiconductor substrate 100, the through electrode 125 may be formed by depositing the barrier layer 115 on an inner wall of the trench and by filling the trench with the metal through electrode 120. In various embodiments, the through electrode 125 may be formed to fill the trench and to protrude from the first surface 100a of the semiconductor substrate 100. If only the metal through electrode 120 protrudes from the first surface 100a of the semiconductor substrate 100, the through electrode 125 may be formed to include a "reversed T"-shaped cross-sectional view. The barrier layer 115 may be formed to suppress or prevent metal atoms in the metal through electrode 120 from being diffused into the semiconductor substrate 100. The barrier layer 115 may be formed to include at least one selected from the group consisting of a titanium (Ti) material, a titanium nitride (TiN) material, a tantalum (Ta) material and a tantalum nitride (TaN) material.

The metal through electrode 120 may be formed to include, for example, a copper (Cu) material, a silver (Ag) material or a tin (Sn) material. Although not illustrated in the drawings, at least two through electrodes 125 may be formed in the semiconductor substrate 100 to be spaced apart from each other. The through electrode 125 may include a first end surface 125a adjacent to the first surface 100a of the semiconductor substrate 100 and a second end surface 125b adjacent to the second surface 100b of the semiconductor substrate 100.

An interconnection portion 128 for electrically connecting the through electrode 125 to the circuit pattern 130 may be formed in the interlayer insulation layer 106. The interconnection portion 128 may be formed to include an interconnection pattern 126 disposed on the first end surface 125a of the through electrode 125 and a vertical plug 127 disposed between the interconnection pattern 126 and the circuit pattern 130. The bonding pad 135 may be formed on the vertical plug 127. The bonding pad 135 may be formed to be electrically connected to the through electrode 125 via the circuit pattern 130 and the interconnection portion 128. The bonding pad 135 may be formed to include, for example, an aluminum (Al) material or a copper (Cu) material. A second insulation layer 140 may be formed on the first insulation layer 131 to cover the bonding pad 135 and the circuit pattern 130. A first passivation layer 142 may be formed on the second insulation layer 140. The first passivation layer 142 may be formed to include an insulation material, for example, a silicon oxide material.

Figure 4:
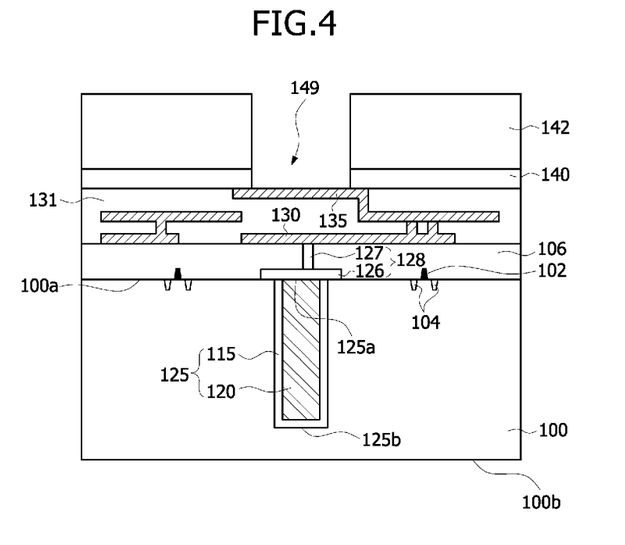

Referring to FIG. 4, the first passivation layer 142 and the second insulation layer 140 may be patterned to form an opening 149. The opening 149 may be formed to expose the bonding pad 135.

Figure 5:
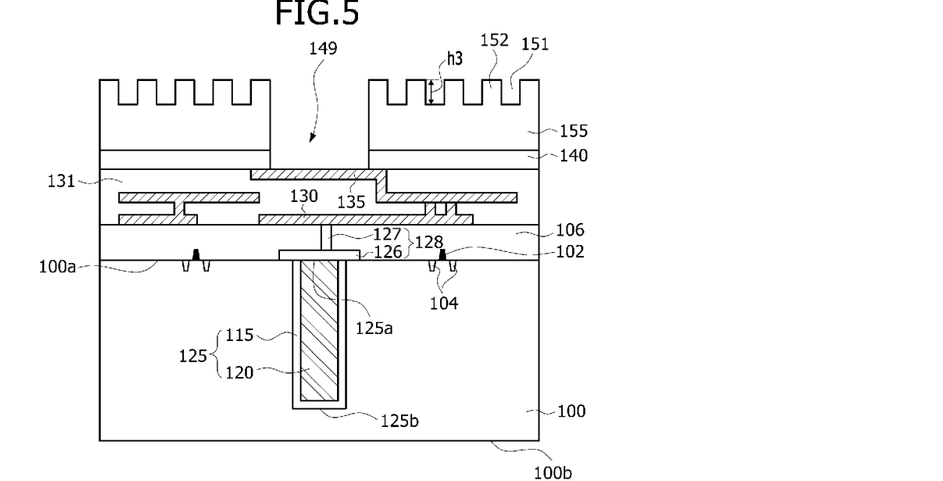

Referring to FIG. 5, after the opening 149 is formed, predetermined portions of the first passivation layer 142 may be selectively etched to form a first passivation pattern 155 including an uneven surface. The uneven surface of the first passivation pattern 155 may be provided by first protrusions 152 and first grooves 151 between the first protrusions 152. The first grooves 151 may be formed by applying a dry etch process to the predetermined portions of the first passivation layer 142. The first grooves 151 may be formed by etching the predetermined portions of the first passivation layer 142 by a predetermined thickness. The first protrusions 152 of the first passivation pattern 155 may be formed to include a first height H3 (corresponding to the predetermined thickness) from bottom surfaces of the first grooves 151.

Figure 6:
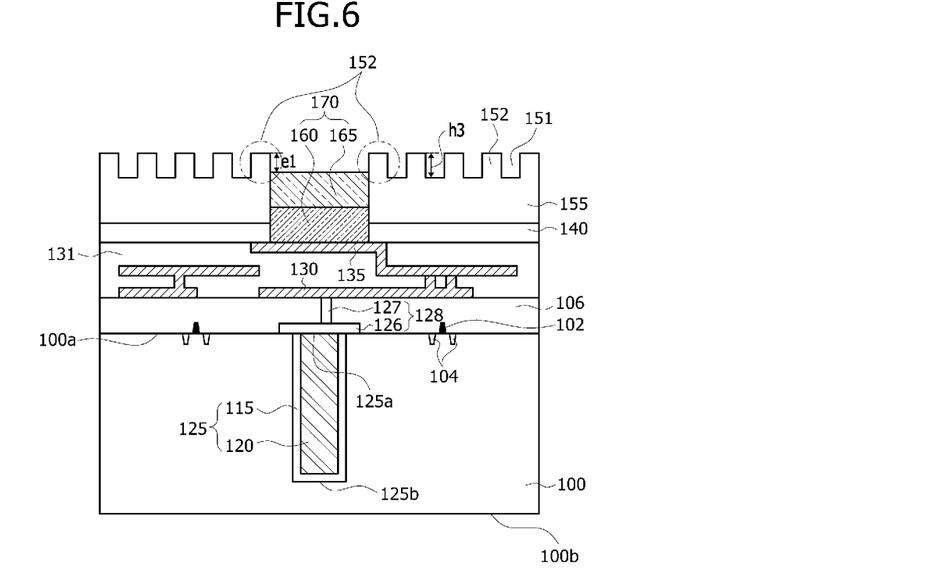

Referring to FIG. 6, a first metal layer 160 and a second metal layer 165 may be formed in the opening 149 on the exposed bonding pad 135. The first metal layer 160 and the second metal layer 165 may constitute a front side bump 170. Before the first metal layer 160 is formed on the exposed bonding pad 135, a seed metal layer (not shown) may be formed on the exposed bonding pad 135. The first metal layer 160 may be formed using an electro-plating process. If the first metal layer 160 is formed using an electro-plating process, the first metal layer 160 may be selectively formed on the exposed bonding pad 135. The first metal layer 160 may be formed to include a pillar shape. The second metal layer 165 may be formed on the first metal layer 160. The first metal layer 160 may be formed to include, for example, a copper (Cu) material, and the second metal layer 165 may be formed to include a silver (Ag) material or a tin (Sn) material.

The first protrusions 152 may be formed such that one of the first protrusions 152 is adjacent to the opening 149 to substantially surround or surround an upper region of the opening 149. The front side bump 170 may be formed such that a top surface of the front side bump 170 is lower than top surfaces of the first protrusions 152. The first protrusions 152 may include a first height E1 from the top surface of the front side bump 170. Thus, a level difference may exist between the front side bump 170 and the first protrusion 152 adjacent to the front side bump 170. The first protrusion 152 adjacent to the front side bump 170 may be higher than the front side bump 170 to function as a sill of the opening 149. A function of the first protrusion 152 adjacent to the front side bump 170 will be described in detail with reference to FIG. 14.

Figure 7:
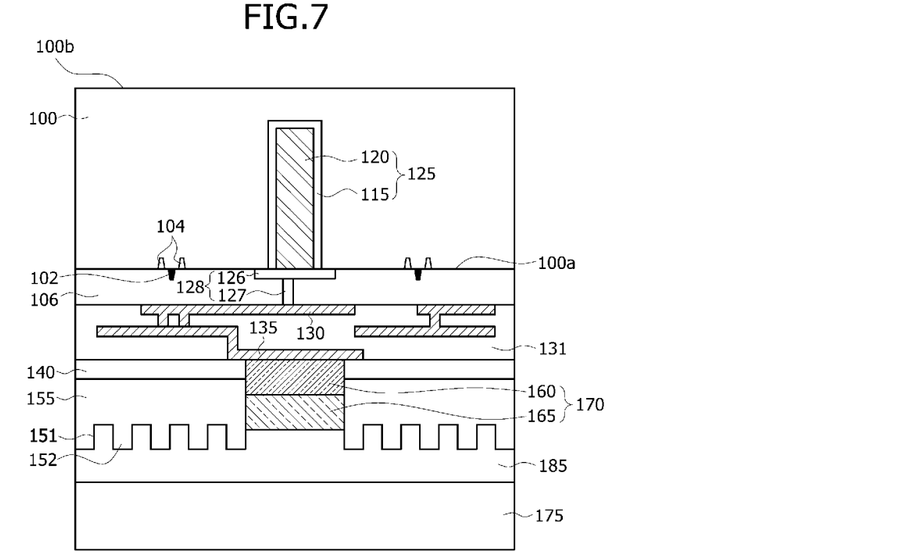

Referring to FIG. 7, a carrier substrate 175 may be attached to a surface of the first passivation pattern 155. The carrier substrate 175 may be attached to the uneven surface of the first passivation pattern 155 using an adhesive layer 185. The adhesive layer 185 may be formed to cover the first protrusions 152 of the first passivation pattern 155. After the carrier substrate 175 is attached to the first passivation pattern 155, the substrate including the carrier substrate 175 may be turned upside down such that the second surface 100b of the semiconductor substrate 100 is upwardly located and the first surface 100a of the semiconductor substrate 100 is downwardly located.

Figure 8:
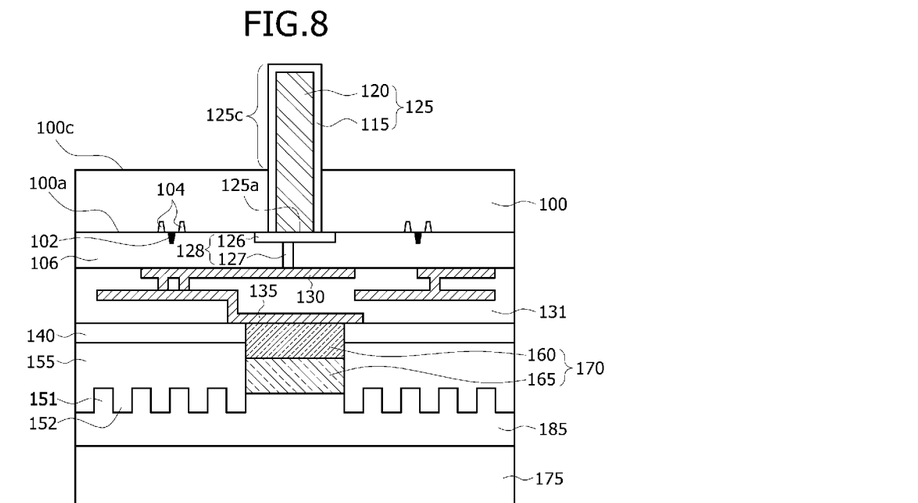

Referring to FIG. 8, a backside portion of the semiconductor substrate 100 may be recessed by a predetermined thickness to expose a portion of the through electrode 125. Specifically, a grinding process may be applied to the second surface 100b of the semiconductor substrate 100 to remove a backside portion of the semiconductor substrate 100, and the semiconductor substrate 100 may be selectively etched such that a backside surface of the semiconductor substrate 100 is located at a lower level than the second end surface (125b of FIG. 6) of the through electrode 125. As a result, a portion of the through electrode 125 may relatively protrude from a recessed second surface 100c of the semiconductor substrate 100 to form a protrusion 125c. In various embodiments, the second surface 100b of the semiconductor substrate 100 may be recessed and/or etched using at least one selected from the group comprising of, for example, a grinding process, a chemical mechanical polishing (CMP) process, a dry etch process and a wet etch process.

Figure 9:
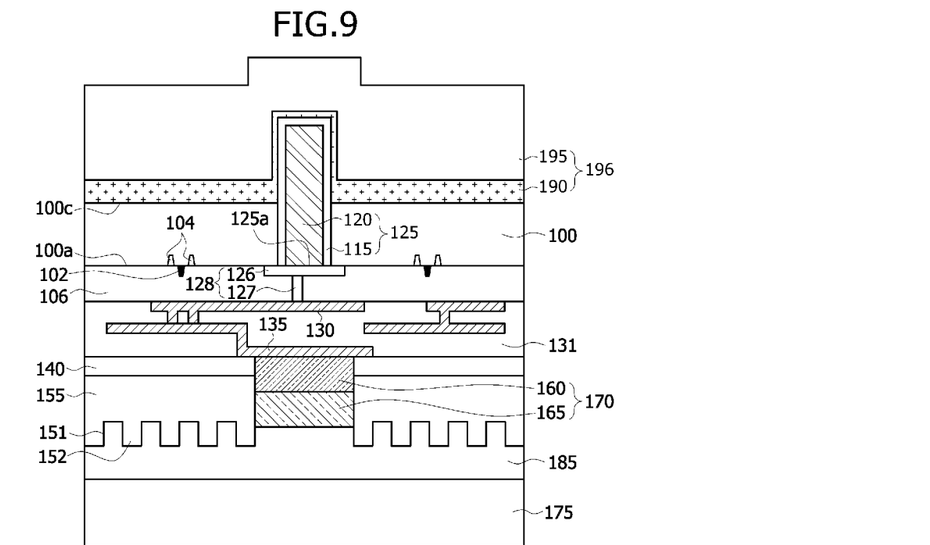

Referring to FIG. 9, a second passivation layer 196 may be formed on the recessed second surface 100c of the semiconductor substrate 100. The second passivation layer 196 may be formed to cover the protrusion (125c of FIG. 8) of the through electrode 125. In an example, the second passivation layer 196 may be formed to include a rugged surface profile because of the presence of the protrusion (125c of FIG. 8) of the through electrode 125. The second passivation layer 196 may be formed to include a lower insulation layer 190 and an upper insulation layer 195 which are sequentially stacked. The lower insulation layer 190 may be formed to include, for example, a nitride material. In an example, the upper insulation layer 195 may be formed to include, for example, a silicon oxide material.

Figure 10:
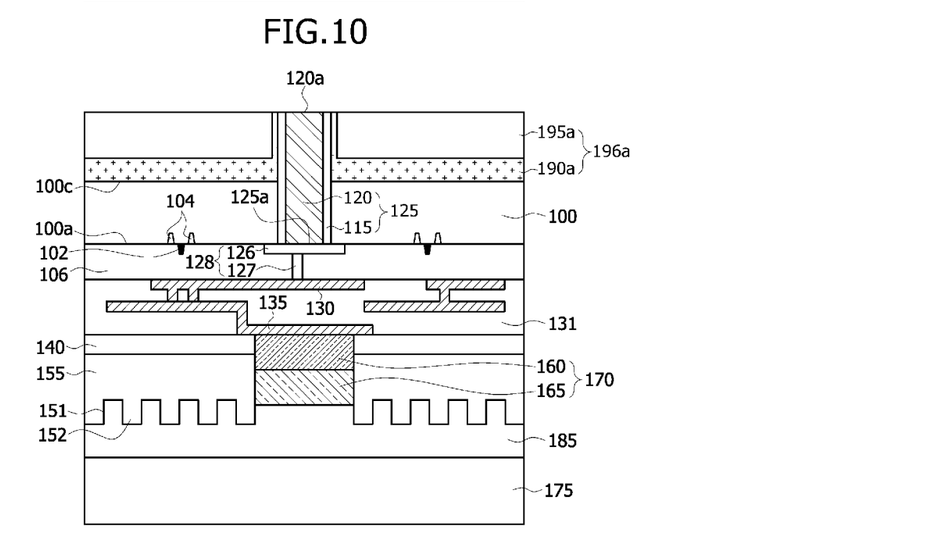

Referring to FIG. 10, a planarization process may be applied to the second passivation layer 196 to form a second passivation layer 196a including a flat surface. The second passivation layer 196a including a flat surface may include an upper insulation layer 195a and a lower insulation layer 190a. The planarization process may be performed using a CMP process to make the rugged surface of the second passivation layer 196 flat. The planarization process may be performed until an end surface 120a of the metal through electrode 120 is exposed. Therefore, the second passivation layer 196a on the end surface 120a of the metal through electrode 120 may be removed during the planarization process.

Figure 11:
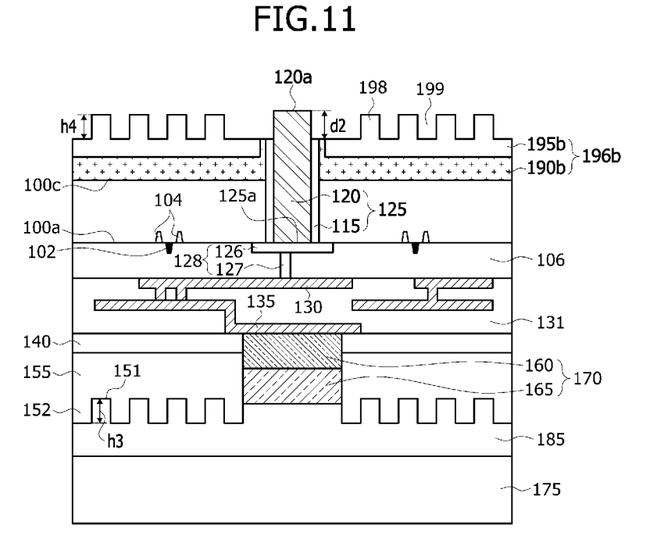

Referring to FIG. 11, predetermined portions of the planarized second passivation layer 196a may be selectively etched to form a second passivation pattern 196b including an uneven surface. The second passivation pattern 196b may include an upper insulation pattern 195b and a lower insulation pattern 190b. The uneven surface of the second passivation pattern 196b may be provided by second protrusions 198 and second grooves 199 between the second protrusions 198, and the upper insulation pattern 195b may be formed to include the second protrusions 198. The uneven surface of the second passivation pattern 196b may be provided by forming a mask pattern (not shown) on the planarized second passivation layer 196a and by etching the planarized second passivation layer 196a using the mask pattern as an etch mask. The second protrusions 198 of the second passivation pattern 196b may be formed to include a second height H4 from bottom surfaces of the second grooves 199.

While an etch process for forming the second passivation pattern 196b is performed, a portion of the barrier layer 115 may be etched to expose an end of the metal through electrode 120. The exposed portion of the metal through electrode 120 may include a predetermined height D2. The second protrusions 198 may be formed such that the second height H4 of the second protrusions 198 is substantially equal to the first height H3 of the first protrusions 152.

Figure 12:
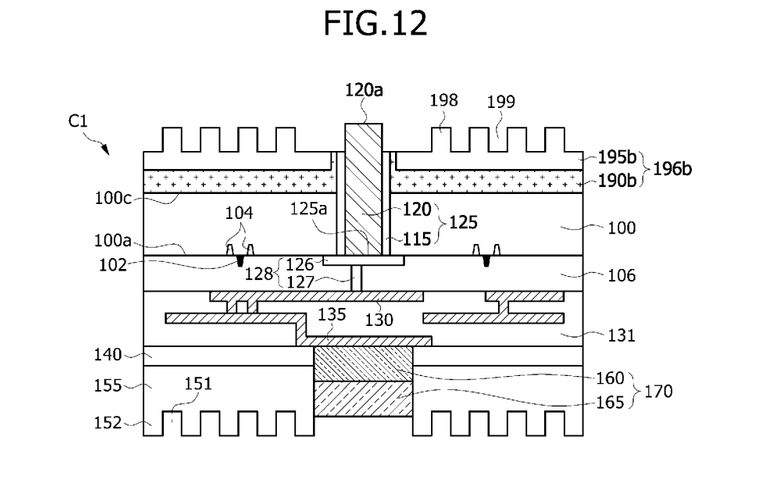

Referring to FIG. 12, the carrier substrate (175 of FIG. 11) and the adhesive layer (185 of FIG. 11) may be removed to realize a first semiconductor chip C1. As a result, the first semiconductor chip C1 may be formed to include the front side bump 170 disposed on the first surface 100a of the semiconductor substrate 100 and the metal through electrode 120 protruding from the recessed second surface 100c of the semiconductor substrate 100 without any backside bumps. The first passivation pattern 155 including the first protrusions 152 protruding from a surface of the front side bump 170 may be formed on the first surface 100a of the semiconductor substrate 100, and the second passivation pattern 196b including the second protrusions 198 may be formed on the recessed second surface 100c of the semiconductor substrate 100.

At least one semiconductor chip may be additionally bonded to or combined with a top surface or a bottom surface of the first semiconductor chip C1 to form a stack package.

Figure 13:
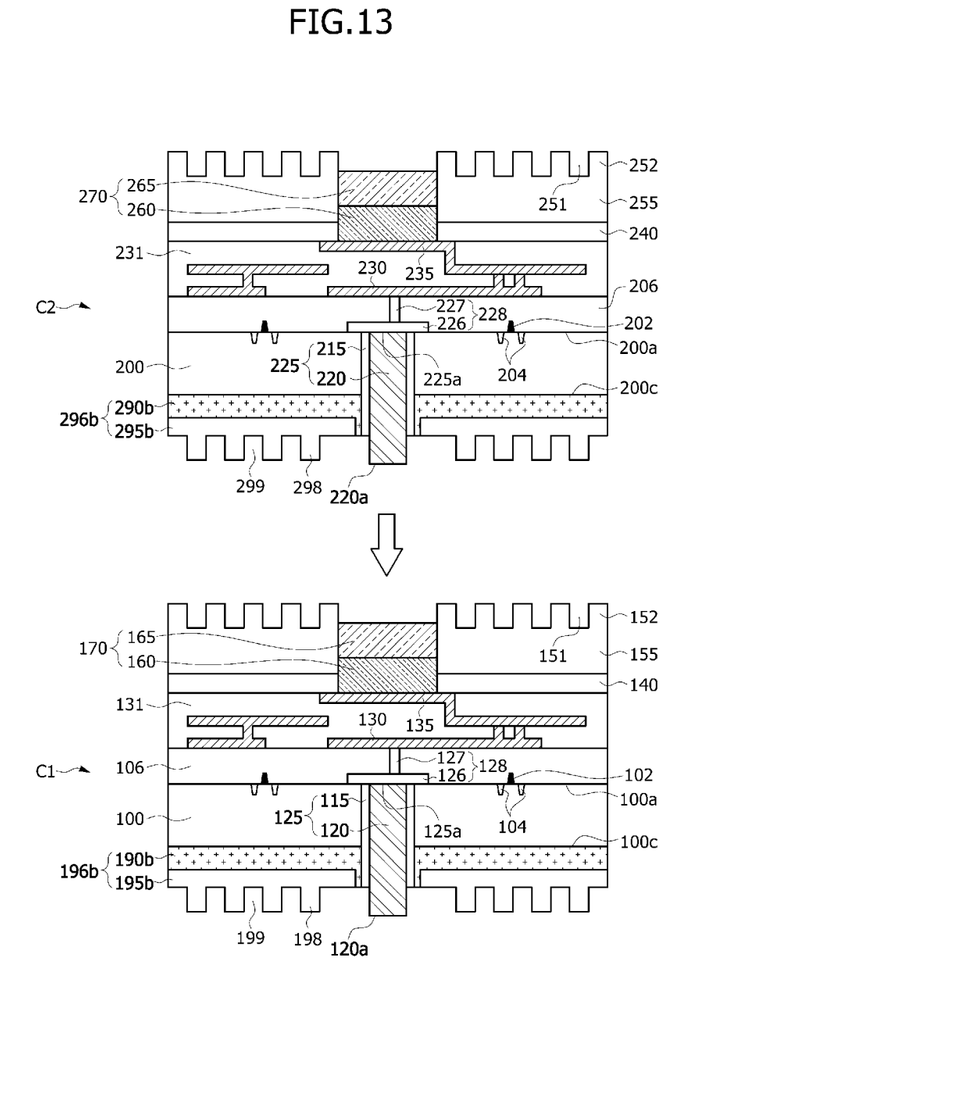
FIGS. 13 and 14 cross-sectional views illustrating a representation of a method of manufacturing a semiconductor package according to an embodiment.
Figure 14:
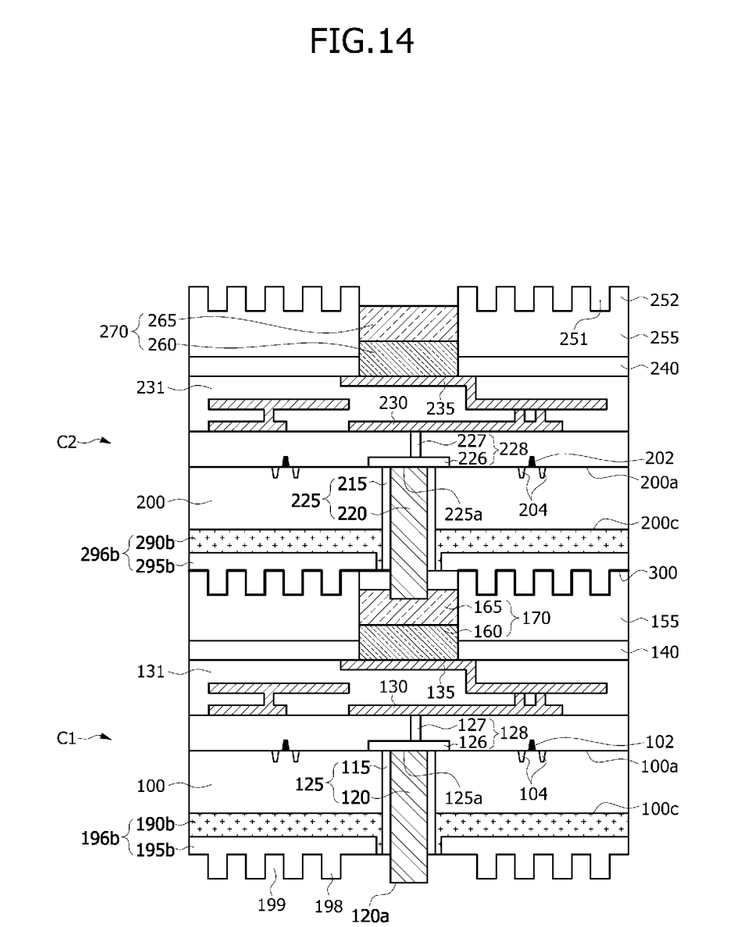

FIGS. 13 and 14 cross-sectional views illustrating a representation of a method of manufacturing a semiconductor stack package according to an embodiment.

Referring to FIG. 13, the first semiconductor chip C1 illustrated in FIG. 12 and a second semiconductor chip C2 may be prepared. The second semiconductor chip C2 may be formed using the same method as described with reference to FIGS. 3 to 12. Accordingly, the fabrication method of the second semiconductor chip C2 will be omitted hereinafter.

The second semiconductor chip C2 may include a semiconductor substrate 200 and a through electrode 225 penetrating the semiconductor substrate 200. The semiconductor substrate 200 may include a first surface 200a and a recessed second surface 200c opposing each other. The through electrode 225 may include a barrier layer 215 and a metal through electrode 220. In addition, the through electrode 225 may include a first end surface 225a adjacent to the first surface 200a. The metal through electrode 220 may include an end surface 220a adjacent to the recessed second surface 200c. An interlayer insulation layer 206, a first insulation layer 231 and a second insulation layer 240 may be sequentially stacked on the first surface 200a. An interconnection portion 228 may be disposed in the interlayer insulation layer 206. The interconnection portion 228 may include an interconnection pattern 226 formed on the first end surface 225a of the through electrode 225 and a vertical plug 227 formed on the interconnection pattern 226. A circuit pattern 230 connected to the vertical plug 227 and a bonding pad 235 connected to the circuit pattern 230 may be disposed in the first insulation layer 231. Transistors including gates 202 and source/drain regions 204 may be disposed between the semiconductor substrate 100 and the interlayer insulation layer 206.

The second semiconductor chip C2 may further include a front side bump 270 and a first passivation pattern 255. The front side bump 270 may be disposed on the first surface 200a of the semiconductor substrate 200 and may be electrically connected to the through electrode 225. The first passivation pattern 255 may be disposed on the second insulation layer 240 to include an uneven surface provided by first protrusions 252 and first grooves 251 between the first protrusions 252. The front side bump 270 may penetrate the first passivation pattern 255 and the second insulation layer 240 to contact the bonding pad 235. The front side bump 270 may include a first metal layer 260 and a second metal layer 265 sequentially stacked on the bonding pad 235. A second passivation pattern 296b may be formed on the recessed second surface 200c of the semiconductor substrate 200, and a surface of the second passivation pattern 296b opposite to the semiconductor substrate 200 may include an uneven surface provided by second protrusions 298 and second grooves 299 between the second protrusions 298. The metal through electrode 220 of the through electrode 225 may penetrate the second passivation pattern 296b to protrude from bottom surfaces of the second grooves 299 by a predetermined height. The second passivation pattern 296b may include a lower insulation pattern 290b and an upper insulation pattern 295b sequentially stacked on the recessed second surface 200c of the semiconductor substrate 200.

The lower insulation pattern 290b may be formed to include, for example, a nitride material. The upper insulation pattern 295b stacked on the lower insulation pattern 290b may include an insulation material different from the lower insulation pattern 290b. The upper insulation pattern 295b may form the same material with the first passivation pattern 155 of the first semiconductor chip C1. In an example, the upper insulation pattern 295b may be formed to include, for example silicon oxide material.

Subsequently, the second semiconductor chip C2 may be disposed on the first semiconductor chip C1. The second semiconductor chip C2 may be disposed on the first semiconductor chip C1 such that the recessed second surface 200c of the second semiconductor chip C2 faces the first surface 100a of the first semiconductor chip C1. In such examples, the metal through electrode 220 and the second passivation pattern 296b of the second semiconductor chip C2 may face the front side bump 170 and the first passivation pattern 155 of the first semiconductor chip C1. The second semiconductor chip C2 may be disposed on the first semiconductor chip C1 such that the second protrusions 298 of the second passivation pattern 296b of the second semiconductor chip C2 are vertically aligned with respective ones of the first grooves 151 of the first passivation pattern 155 of the first semiconductor chip C1.

Next, a plasma treatment process may be applied to the first and second semiconductor chips C1 and C2. The plasma treatment process may activate surfaces of the first and second passivation patterns 155 and 296b such that the first and second passivation patterns 155 and 296b can be easily bonded to each other.

Referring to FIG. 14, the first and second semiconductor chips C1 and C2 may be bonded to each other. Heat and pressure may be applied to the first and second semiconductor chips C1 and C2 in order to bond the second semiconductor chip C2 to the first semiconductor chip C1. In various embodiments, the bonding process may be performed by pressing down the second semiconductor chip C2 with force of about 450 newton (N) to about 540 newton (N) at a temperature of about 130 degrees Celsius to about 170 degrees Celsius. If the bonding process is performed, the protrusion of the metal through electrode 220 of the second semiconductor chip C2 may be inserted into the second metal layer 165 of the front side bump 170 of the first semiconductor chip C1 and the second protrusions (298 of FIG. 13) of the second passivation pattern 296b of the second semiconductor chip C2 may be inserted into respective ones of the first grooves (151 of FIG. 13) of the first passivation pattern 155 of the first semiconductor chip C1. As a result of the bonding process, the first and second passivation patterns 155 and 296b may be combined with each other to form a bridging layer 300 therebetween. Accordingly, the first and second semiconductor chips C1 and C2 may be bonded to each other even without using a buffer layer or an adhesive agent.

While the first and second semiconductor chips C1 and C2 are bonded to each other by heat and pressure, the second metal layer 165 may include fluidity due to the heat when the metal through electrode 220 of the second semiconductor chip C2 is inserted into the second metal layer 165 of the front side bump 170 of the first semiconductor chip C1. In such examples, if a top surface of the front side bump 170 is coplanar with top surfaces of the first protrusions 152 of the first passivation pattern 155, a portion of the second metal layer 165 of the first semiconductor chip C1 may overflow to move into the first grooves 151 adjacent to the front side bump 170. However, according to an embodiment, a space on a top surface of the front side bump 170 may be surrounded by one of the first protrusions 152 of the first passivation pattern 155. Thus, the first passivation pattern 155 including the first protrusions 152 may prevent the second metal layer 165 of the first semiconductor chip C1 from overflowing when the first and second semiconductor chips C1 and C2 are bonded to each other.

Moreover, in various embodiments, the capping layer (see '54' of FIG. 2) may be additionally disposed to cover the protrusions of the metal through electrodes 120 and 220. The capping layer may prevent an inter-metallic compound (IMC) material from being excessively grown between the metal through electrode 220 of the second semiconductor chip C2 and the front side bump 170 of the first semiconductor chip C1 even though the first and second semiconductor chips C1 and C2 are bonded to each other. The capping layer may be formed to include at least one selected from the group comprising of, for example, a nickel (Ni) material and a gold (Au) material layer using an electroless plating technique.

Although FIGS. 13 and 14 illustrate an example in which only two semiconductor chips are bonded to each other, the application is not limited thereto. That is, in some embodiments, three or more semiconductor chips can be sequentially stacked using the same technique as described with reference to FIGS. 13 and 14.

At least one of the semiconductor devices described above may be applied to various electronic systems.

Figure 15:
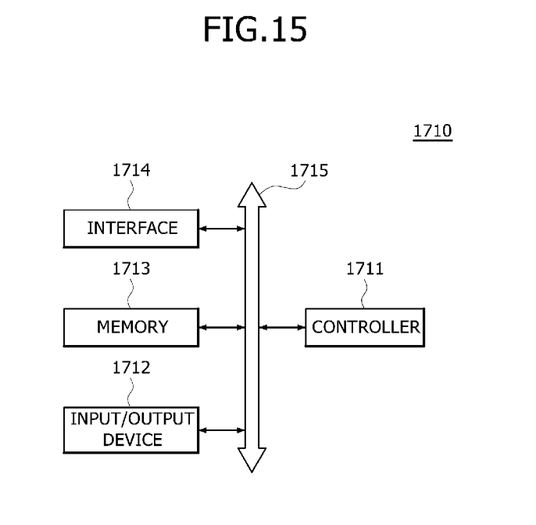
FIG. 15 is a block diagram illustrating a representation of an electronic system including at least one of the semiconductor devices according to some embodiments.

Referring to FIG. 15, the semiconductor device in accordance with an embodiment may be applied to an electronic system 1710. The electronic system 1710 may include a controller 1711, an input/output unit 1712, and a memory 1713. The controller 1711, the input/output unit 1712, and the memory 1713 may be coupled with one another through a bus 1715 providing a path through which data move.

For example, the controller 1711 may include at least any one of, for example, at least one microprocessor, at least one digital signal processor, at least one microcontroller, and logic devices capable of performing the same functions as these components. At least one of the controller 1711 and the memory 1713 may include at least any one of the semiconductor devices according to the embodiments of the present disclosure. The input/output unit 1712 may include at least one selected among a keypad, a keyboard, a display device, a touch screen and so forth. The memory 1713 is a device for storing data. The memory 1713 may store data and/or commands to be executed by the controller 1711, and the like.

The memory 1713 may include a volatile memory device such as a DRAM and/or a nonvolatile memory device such as a flash memory. For example, a flash memory may be mounted to an information processing system such as a mobile terminal or a desk top computer. The flash memory may constitute a solid state disk (SSD). In this case, the electronic system 1710 may stably store a large amount of data in a flash memory system.

The electronic system 1710 may further include an interface 1714 configured to transmit and receive data to and from a communication network. The interface 714 may be a wired or wireless type. For example, the interface 1714 may include an antenna or a wired or wireless transceiver.

The electronic system 1710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

In an embodiment wherein the electronic system 1710 is an equipment capable of performing wireless communication, the electronic system 1710 may be used in a communication system such as a system employing one or more of CDMA (code division multiple access), GSM (global system for mobile communications), NADC (North American digital cellular), E-TDMA (enhanced-time division multiple access), WCDAM (wideband code division multiple access), CDMA2000, LTE (long term evolution) and Wibro (wireless broadband Internet).

Figure 16:
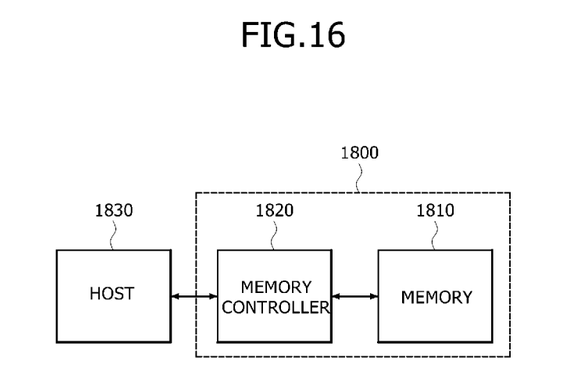
FIG. 16 is a block diagram illustrating a representation of an electronic system including at least one of the semiconductor devices according to some embodiments.

Referring to FIG. 16, the semiconductor device in accordance with the embodiments may be provided in the form of a memory card 1800. For example, the memory card 1800 may include a memory 1810 such as a nonvolatile memory device and a memory controller 1820. The memory 1810 and the memory controller 1820 may store data or read stored data.

The memory 1810 may include at least any one among nonvolatile memory devices to which the packaging technology of the embodiments of the present disclosure is applied. The memory controller 1820 may control the memory 1810 such that stored data is read out or data is stored in response to a read/write request from a host 1830.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A semiconductor device comprising:
   a substrate including a first surface and a second surface;
   a through electrode penetrating the substrate creating a protrusion, the protrusion protruding from the second surface of the substrate;
   a front side bump electrically coupled to the through electrode and disposed on the first surface of the substrate;
   a first passivation pattern disposed on the first surface of the substrate to substantially surround a sidewall of the front side bump and formed to include an uneven surface defined by first protrusions and first grooves between the first protrusions; and
   a second passivation pattern disposed on the second surface of the substrate and formed to include an uneven surface defined by second protrusions and second grooves between the second protrusions,
   wherein the protrusion of the through electrode penetrates the second passivation pattern to protrude from the uneven surface of the second passivation pattern.

2. The semiconductor device of claim 1,
   wherein the first surface of the substrate corresponds to a front side surface adjacent to active regions disposed in the substrate; and
   wherein the second surface of the substrate corresponds to a backside surface opposing the first surface.

3. The semiconductor device of claim 1, wherein the through electrode includes a metal material.

4. The semiconductor device of claim 1, wherein the front side bump includes a first metal layer including substantially a pillar shape and a second metal layer formed on the first metal layer.

5. The semiconductor device of claim 4, wherein the first metal layer includes a copper (Cu) material and the second metal layer includes a silver (Ag) material or a tin (Sn) material.

6. The semiconductor device of claim 1, wherein the first protrusions of the first passivation pattern protrude from a surface of the front side bump by a predetermined height.

7. The semiconductor device of claim 1, wherein the first passivation pattern includes an insulation material.

8. The semiconductor device of claim 7, wherein the insulation material of the first passivation pattern includes a silicon oxide ($SiO_2$) material.

9. The semiconductor device of claim 1,
   wherein the second passivation pattern includes a lower insulation layer disposed on the second surface of the substrate and an upper insulation layer disposed on a surface of the lower insulation layer opposite to the substrate; and
   wherein the upper insulation layer includes the second protrusions and the second grooves providing the uneven surface of the second passivation pattern.

10. The semiconductor device of claim 9, wherein the lower insulation layer includes a material different from the upper insulation layer.

11. The semiconductor device of claim 9, wherein the lower insulation layer includes a silicon nitride material.

12. The semiconductor device of claim 9, wherein the upper insulation layer includes a silicon oxide material.

13. The semiconductor device of claim 1, wherein a height of the first protrusions of the first passivation pattern is substantially equal to a height of the second protrusions of the second passivation pattern.

14. The semiconductor device of claim 1, further comprising a capping layer substantially covering the protrusion of the through electrode protruding from the uneven surface of the second passivation pattern.

15. The semiconductor device of claim 14, wherein the capping layer includes at least one selected from the group consisting of a nickel (Ni) material and a gold (Au) material.

16. A semiconductor package comprising:
    a lower semiconductor chip including:
    a first substrate including a first surface and a second surface;
    a first through electrode penetrating the first substrate creating a protrusion, the protrusion protruding from the second surface;
    a front side bump disposed on the first surface of the first substrate and electrically coupled to an end of the first through electrode;
    a first passivation pattern disposed on the first surface of the first substrate and formed to include first protrusions and first grooves between the first protrusions;
    a second passivation pattern disposed on the second surface of the first substrate and formed to include second protrusions and second grooves between the second protrusions; and
    an upper semiconductor chip bonded to the first passivation pattern of the lower semiconductor chip,
    wherein the upper semiconductor chip includes a second through electrode, a portion of the second through electrode inserted into the front side bump of the lower semiconductor chip.

17. The semiconductor package of claim 16, wherein the upper semiconductor chip further includes:
    a second substrate including a first surface and a second surface;

a front side bump disposed on the first surface of the second substrate and electrically coupled to the second through electrode;
a third passivation pattern disposed on the first surface of the second substrate and formed to include third protrusions and third grooves between the third protrusions; and
a fourth passivation pattern disposed on the second surface of the second substrate and formed to include fourth protrusions and fourth grooves between the fourth protrusions,
wherein the second through electrode penetrates the second substrate and the fourth passivation pattern, and the fourth passivation pattern is bonded to the first passivation pattern of the lower semiconductor chip.

18. The semiconductor package of claim 16, wherein the first passivation pattern includes an uneven surface provided by the first protrusions and the first grooves.

19. The semiconductor package of claim 16, wherein the first protrusions protrude from a surface of the front side bump of the lower semiconductor chip.

20. The semiconductor package of claim 16, wherein the insulation material of the first passivation pattern includes a silicon oxide ($SiO_2$) material.

21. The semiconductor package of claim 16,
wherein the second passivation pattern includes a lower insulation layer disposed on the second surface of the first substrate and an upper insulation layer disposed on a surface of the lower insulation layer opposite to the first substrate; and
wherein the second protrusions and the second grooves provides an uneven surface of the upper insulation layer.

22. The semiconductor package of claim 21, wherein the upper insulation layer includes a silicon oxide material.

23. The semiconductor package of claim 16, wherein a height of the first protrusions of the first passivation pattern is substantially equal to a height of the second protrusions of the second passivation pattern.

24. The semiconductor device of claim 16, wherein the first protrusions of the first passivation pattern are vertically aligned with respective ones of the second grooves of the second passivation pattern.

25. The semiconductor device of claim 16, wherein the first grooves of the first passivation pattern are vertically aligned with respective ones of the second protrusions of the second passivation pattern.

* * * * *